United States Patent
Chan et al.

(10) Patent No.: US 7,795,722 B2
(45) Date of Patent: *Sep. 14, 2010

(54) SUBSTRATE STRIP AND SUBSTRATE STRUCTURE AND METHOD FOR MANUFACTURING THE SAME

(75) Inventors: Shu-Luan Chan, Zhongli (TW); Chi-Chih Huang, Taipei (TW); Shuo-Hsun Chang, Zhongli (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 580 days.

This patent is subject to a terminal disclaimer.

(21) Appl. No.: 11/617,138

(22) Filed: Dec. 28, 2006

(65) Prior Publication Data

US 2007/0296062 A1 Dec. 27, 2007

(30) Foreign Application Priority Data

Jun. 21, 2006 (TW) ............................. 95122361 A (51) Int. Cl.
*H01L 23/053* (2006.01)

(52) U.S. Cl. ................. 257/700; 257/758; 257/E23.194

(58) Field of Classification Search ................. 257/734, 257/750, 758, 774, E23.194, 678, 693, 700, 257/621

See application file for complete search history.

(56) References Cited

U.S. PATENT DOCUMENTS

2003/0215566 A1* 11/2003 Kung et al. .................... 427/96

* cited by examiner

*Primary Examiner*—Davienne Monbleau
*Assistant Examiner*—Hoa B Trinh
(74) *Attorney, Agent, or Firm*—Thomas, Kayden, Horstemeyer & Risley, LLP (57) ABSTRACT

A substrate structure is disclosed. The substrate structure includes a core substrate, an interconnection portion and a solder mask. The core substrate includes a top surface and a bottom surface opposite the top surface. A circuit pattern is disposed on the top surface. The interconnection portion is disposed on the top surface; herein the interconnection portion includes a surface dielectric layer and a surface circuit layer disposed on the surface dielectric layer. The surface circuit layer is electrically connected to the circuit pattern. The solder mask is disposed on the interconnection portion; herein the solder mask includes a hole to identify the substrate structure. Besides, a method for manufacturing the substrate structure is disclosed.

14 Claims, 12 Drawing Sheets

Fig. 3

SUBSTRATE STRIP AND SUBSTRATE STRUCTURE AND METHOD FOR MANUFACTURING THE SAME

RELATED APPLICATIONS

The present application is based on, and claims priority from, Taiwan Application Serial Number 95122361, filed Jun. 21, 2006, the disclosure of which is hereby incorporated by reference herein in its entirety.

FIELD OF THE INVENTION

This invention relates generally to a substrate strip, a substrate structure and a method for manufacturing the same, and more particularly, to a substrate strip and a substrate structure both having an identification mark and a method for manufacturing the same.

BACKGROUND OF THE INVENTION

Nowadays, since the need for information is increasing, for accordance with ever-increasing demands for higher operating speeds, versatility, integration and lightweight miniaturization etc. of electronic devices, the process technology also tends to develop semiconductor with miniaturization and high density. In order to reduce the packaging volume, as well as to increase the function of the packaging devices, several advanced packaging technologies, for example, flip-chip package, ball-grid array (BGA) package and chip-scale package (CSP) etc., are widely applied in the industry. As the substrate type carrier has advantages of fine wirings, compact package and well performance etc., it is widely applied in the aforementioned advanced package technology.

Figure 1:
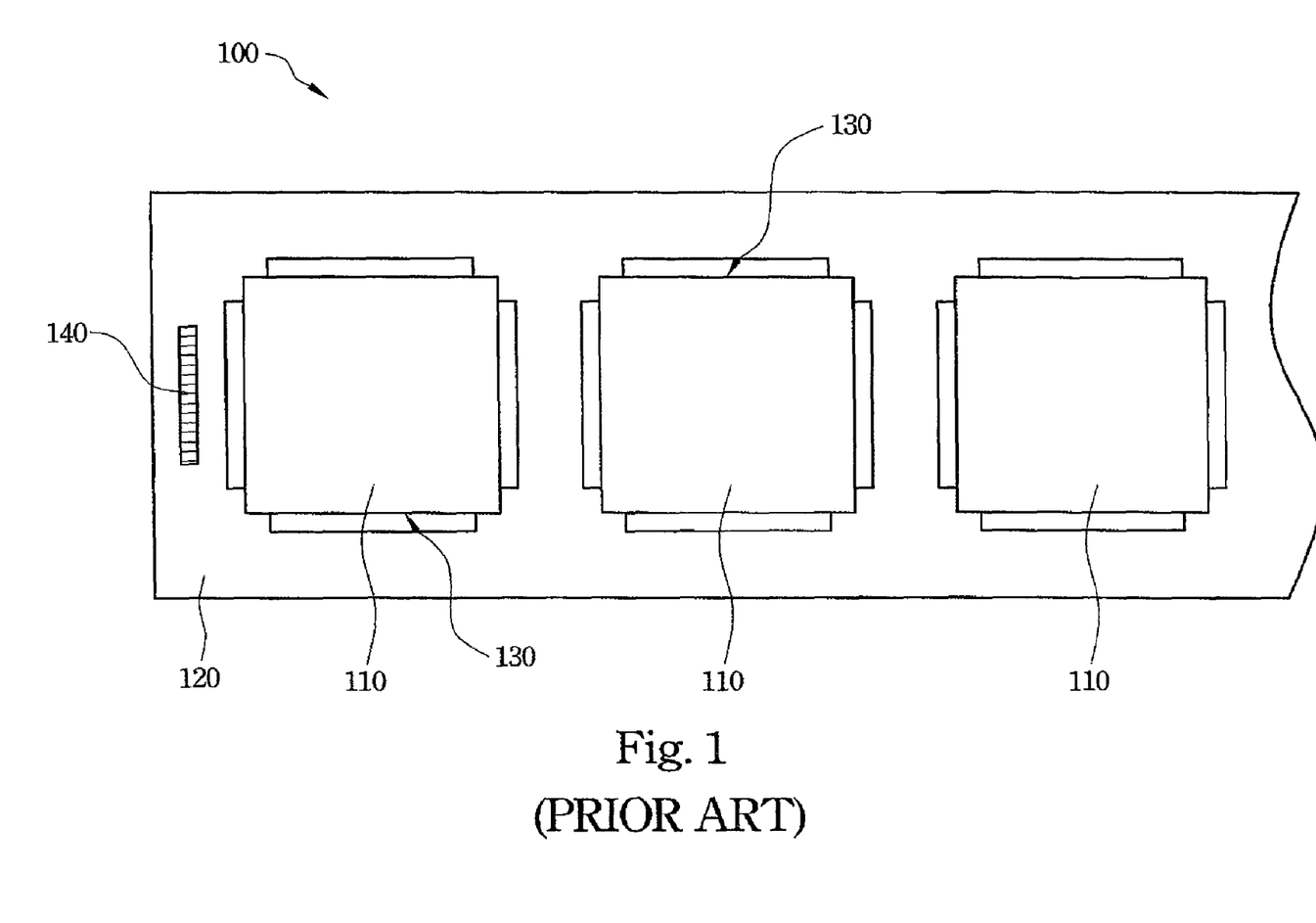
FIG. 1 is a top view of a prior substrate strip in the packaging structure.

Reference is made to FIG. 1, which depicts a top view of a prior substrate strip. The substrate strip 100 is, for example, a multilayer board, which comprises a plurality of substrate units 110 and a frame 120 surrounding the substrate units 110. Each substrate unit 110 is defined as a packaging area, which is assembled with a chip (not shown) together during a packaging process, so as to form a packaging structure (not shown). Comparatively, the frame 120 is defined as a non-packaging area. A plurality of slits 130, which are formed between the substrate unit 110 and the frame 120, separate the substrate 110 from the frame 120, so that the substrate unit 110 is partially connected to the frame 120. After completing the packaging process, a separating process may be performed for separating the substrate 110 from the frame 120, so as to form a plurality of separate packaging structures (not shown). Typically, the frame 120 of the packaging substrate 100 has an identification mark 140 disposed thereon, for identifying the lot number and related process information of the packaging substrate strip 100. Consequently, when there are some qualitative problems occurred in the packaging substrate strip 100, the identification mark 140 can be available to trace the lot number and all related process information of the packaging substrate strip 100, so as to clarify the reason why the problems occurred and to provide trouble shooting. However, once the packaging substrate strip 100 is assembled with the chip together and the packaging process is completed, the separating process will be completed to separate the substrate unit 110 from the frame 120. At this time, if there are some qualitative problems occurring in the separate packaging structures, it will be very difficult to find out which lot number of the packaging substrate strip 100 is used in the separate packaging structures. This results in more difficulties in monitoring process and trouble shooting, as well as less product yield.

SUMMARY OF THE INVENTION

Consequently, there is a need for improving the substrate strip, in order to overcome the problems of hardly monitoring process changes and trouble shooting in the prior process, so as to achieve the purpose that the product quality and process yield are both increased.

It is an aspect of the present invention to provide a substrate strip, which has an identification mark directly fabricated on a substrate unit of the substrate strip to identify each substrate unit, so that it overcomes the prior problems of more difficulties in monitoring process and trouble shooting due to unfavorable quality of the substrate unit in the package structure after completing the packaging process.

It is another aspect of the present invention to provide a substrate structure, which has an identification mark directly fabricated on the substrate structure to identify each substrate structure, for use in packaging process which overcomes the prior problems of more difficulties in monitoring process and trouble shooting due to unfavorable quality of the substrate unit.

It is a further aspect of the present invention to provide a method for manufacturing a substrate structure, which has at least one hole formed on a solder mask thereof by adding a drilling procedure, instead of changing the existing prior process of the substrate structure, so as to fabricate the substrate structure with an identification mark.

According to the aforementioned aspects of the present invention, a substrate structure is provided, which comprises a core substrate, an interconnection portion and a solder mask. The core substrate includes a top surface and a bottom surface opposite the top surface. A circuit pattern is disposed on the top surface. The interconnection portion, which is disposed on the top surface, comprises a surface dielectric layer and a surface circuit layer disposed thereon. The surface circuit layer is electrically connected to the circuit pattern. The solder mask, which is disposed on the interconnection portion, has at least one hole to form an identification mark for identifying the substrate structure.

According to another aspects of the present invention, a substrate strip is provided and comprises a plurality of substrate units and a frame. Each substrate unit comprises a core substrate, an interconnection portion and a solder mask. The core substrate includes a top surface and a bottom surface opposite the top surface. A circuit pattern is disposed on the top surface. The interconnection portion, which is disposed on the top surface, comprises a surface dielectric layer and a surface circuit layer disposed thereon. The surface circuit layer is electrically connected to the circuit pattern. The solder mask, which is disposed on the interconnection portion, has at least one hole to form an identification mark for identifying the substrate strip. Besides, a frame surrounds a periphery of the substrate units for fixing and supporting the substrate units.

According to the further aspect of the present invention, a method for manufacturing a substrate structure is provided and comprises the following steps. A core substrate is provided, which includes a top surface and a bottom surface opposite the top surface and a circuit pattern is disposed on the top surface. Next, an interconnection portion is formed on the top surface by forming a surface dielectric layer on the circuit pattern and forming a surface circuit layer on the surface dielectric layer, in which the surface circuit layer is electrically connected to the circuit pattern through a plurality of vias. And then, the solder mask is formed on the interconnection. Besides, at least one hole is formed on the solder mask.

In a preferred embodiment of the present invention, the aforementioned hole may be, for example, numeral-, character-, or drawing-shaped.

With the application of the aforementioned substrate strip, since an identification mark is directly fabricated on the substrate unit to ensure that the lot numbers of the substrate unit in the packaging structure can be still identified while the packaging process is completed, so as to overcome the prior problems of more difficulties in monitoring process and trouble shooting in the package structure, as well as the problem of the decreased yield. Additionally, the present method for manufacturing the substrate structure is to add a drilling procedure, instead of changing the existing prior process flow, to form at least one hole as an identification mark on the solder mask, for identifying the substrate structure. Therefore, in comparison with the conventional structure and the manufacturing method thereof, the substrate structure disclosed by the present invention is capable of overcoming the prior problems of more difficulties in trouble shooting in the package structure and the problem of the decreased yield, as well as substantially reducing the fabricating time and cost. Besides, the present method for manufacturing the substrate structure can be employed to fabricate the substrate structure having an identification mark, instead of changing the existing prior process flow.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 2A:
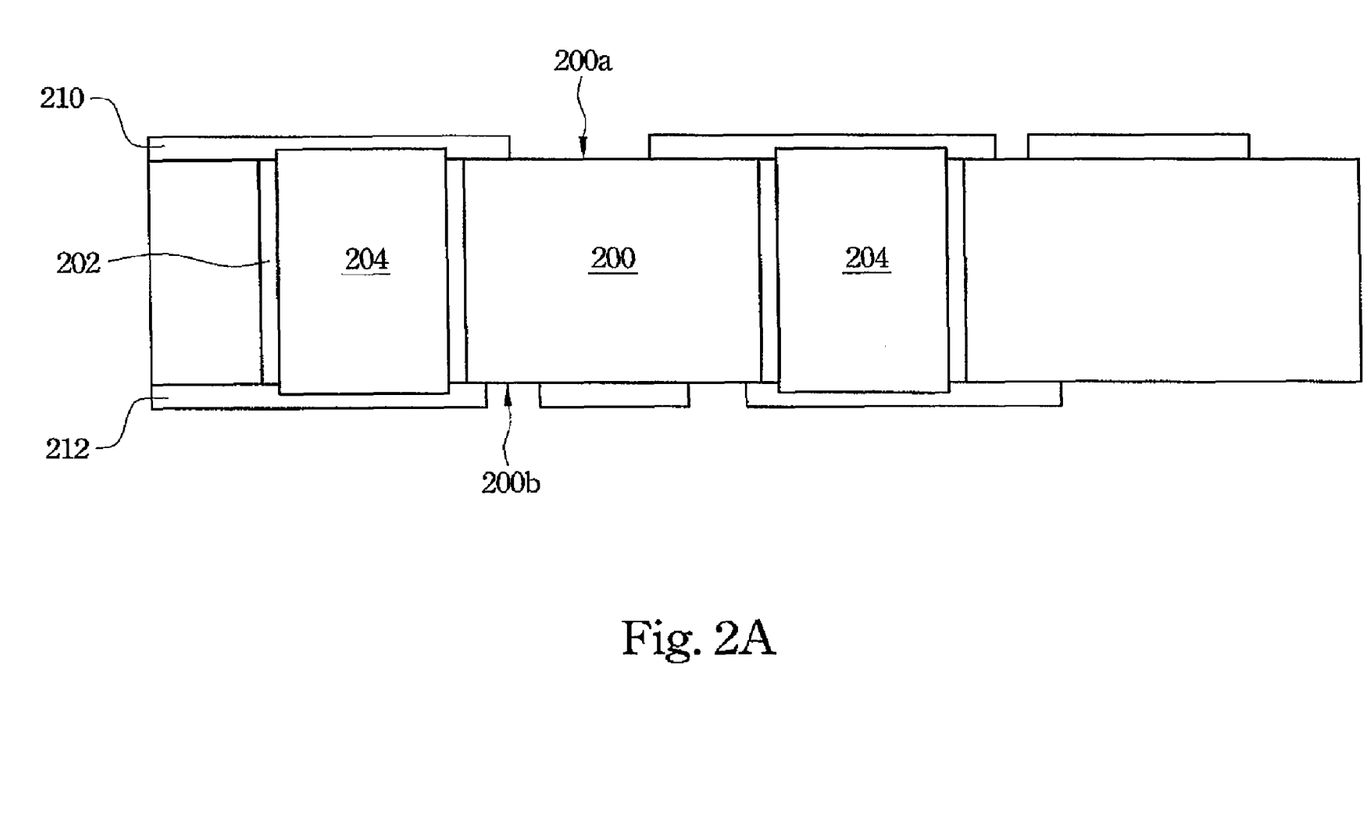
FIGS. 2A to 2J are cross-sectional diagrams of the process flow of a substrate structure according to one preferred embodiment of the present invention.
Figure 2B:
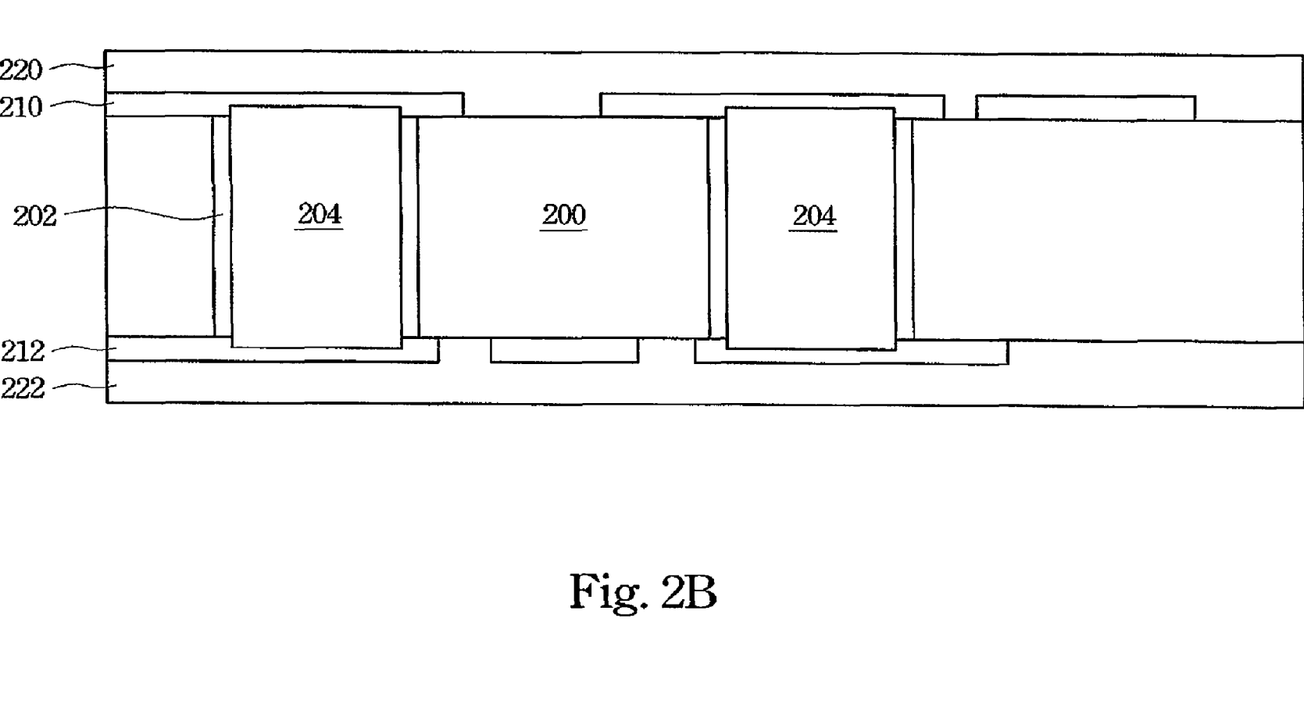
Figure 2C:
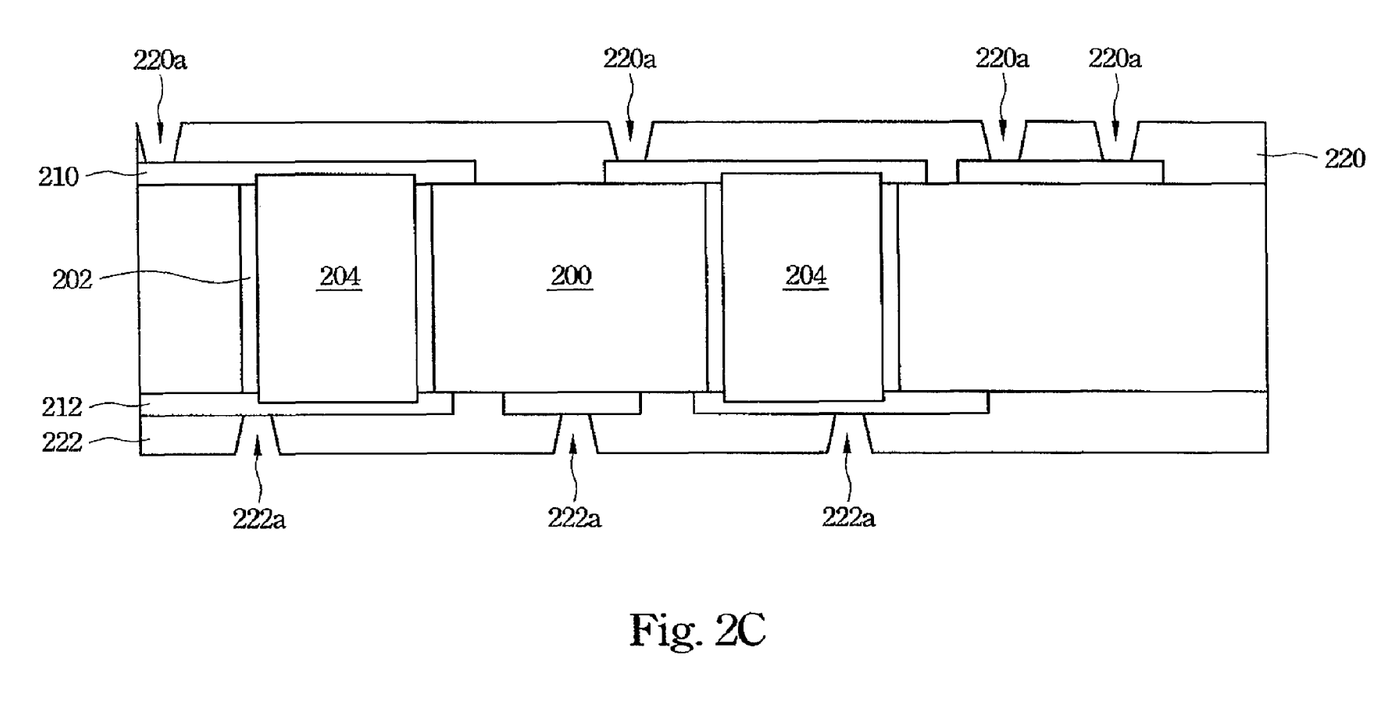
Figure 2D:
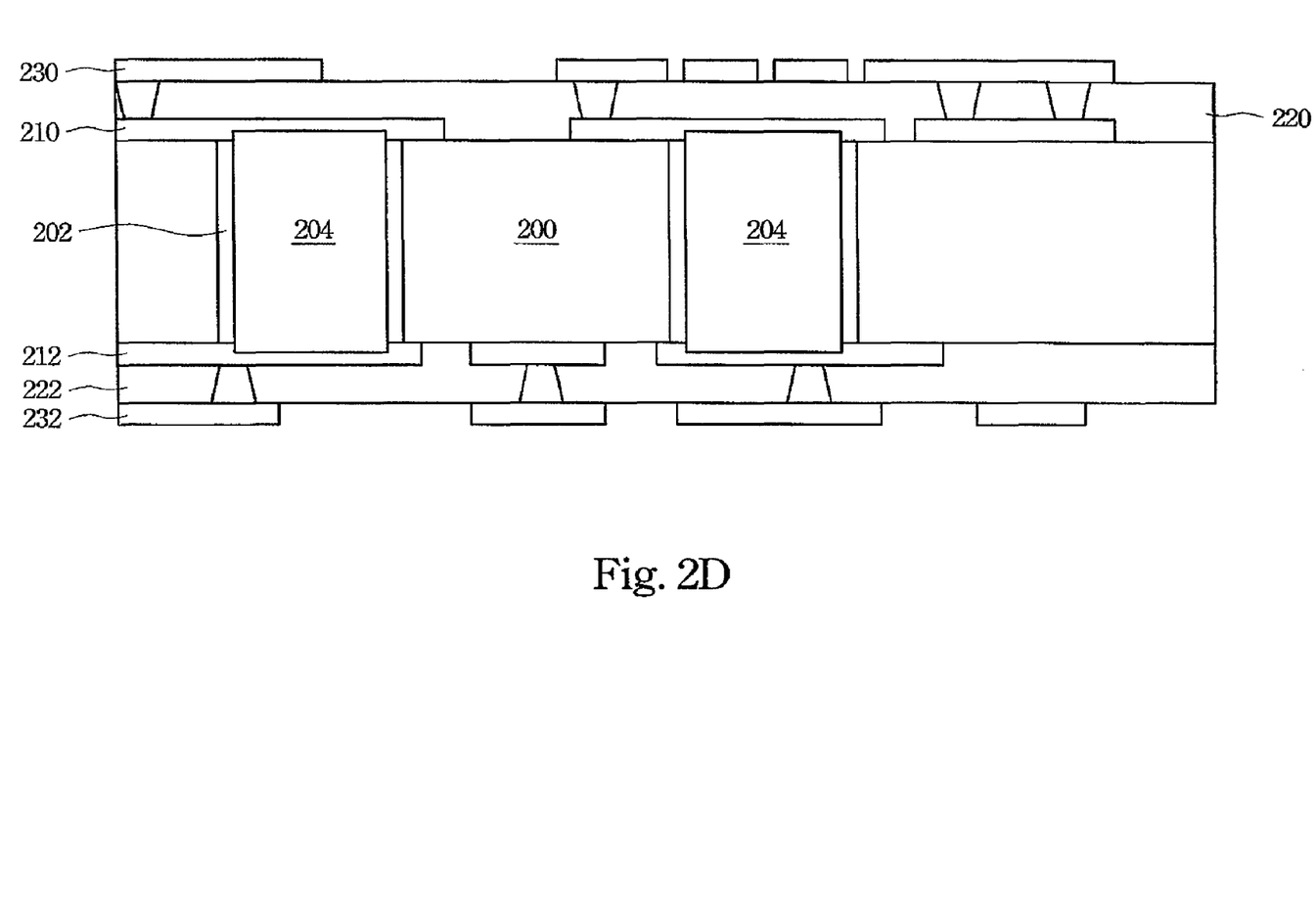
Figure 2E:
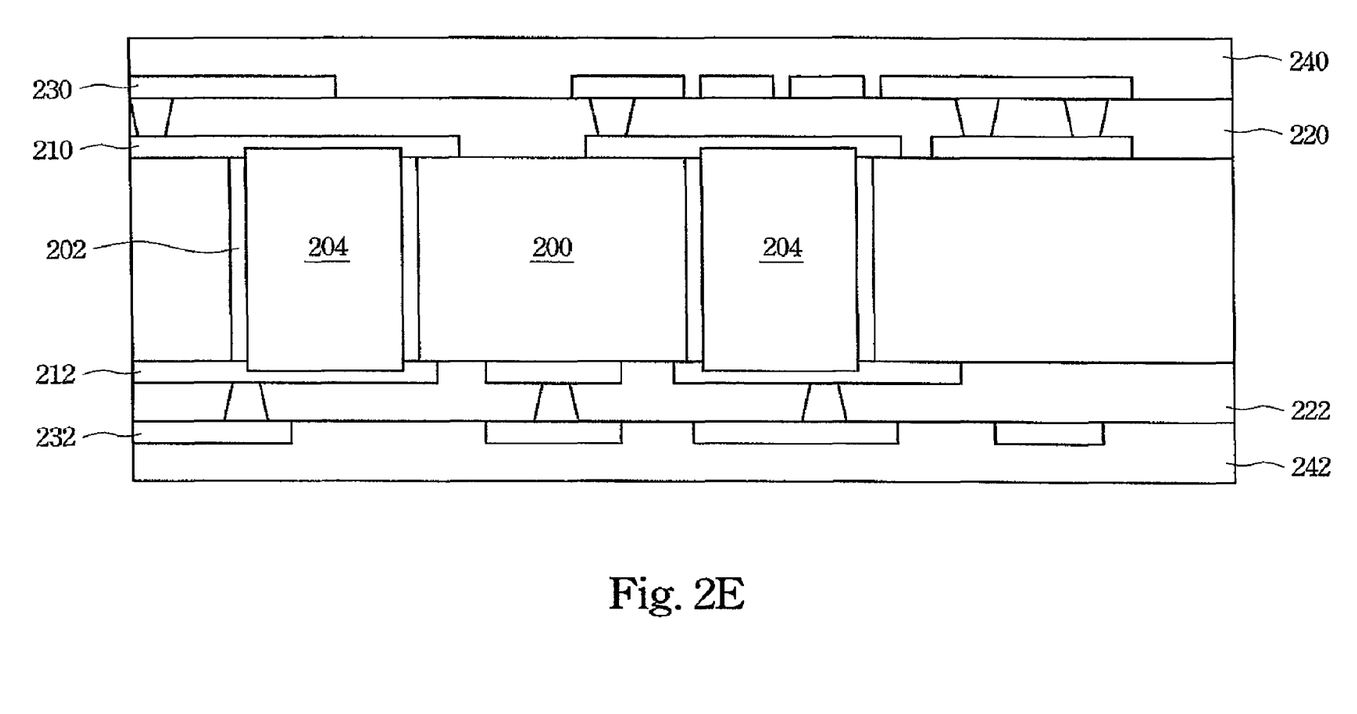
Figure 2F:
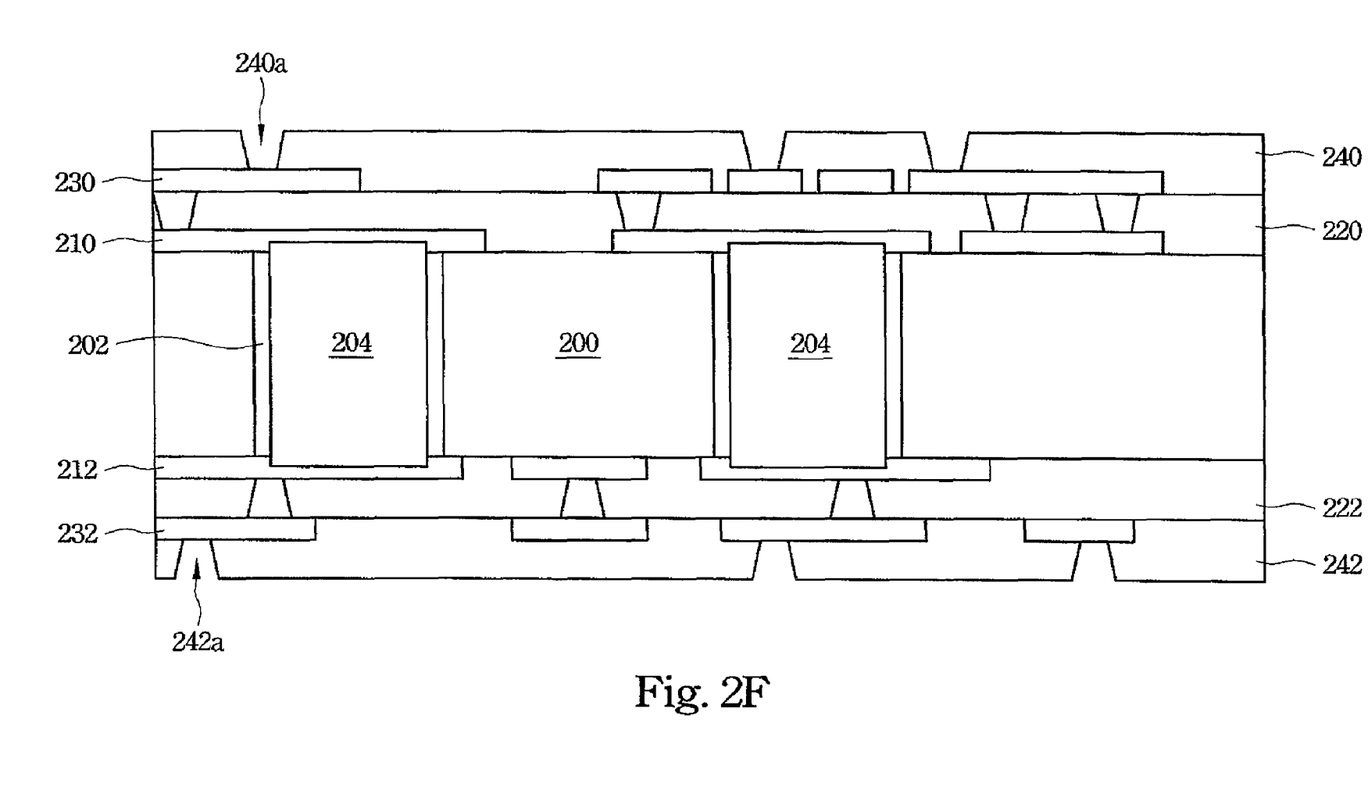
Figure 2G:
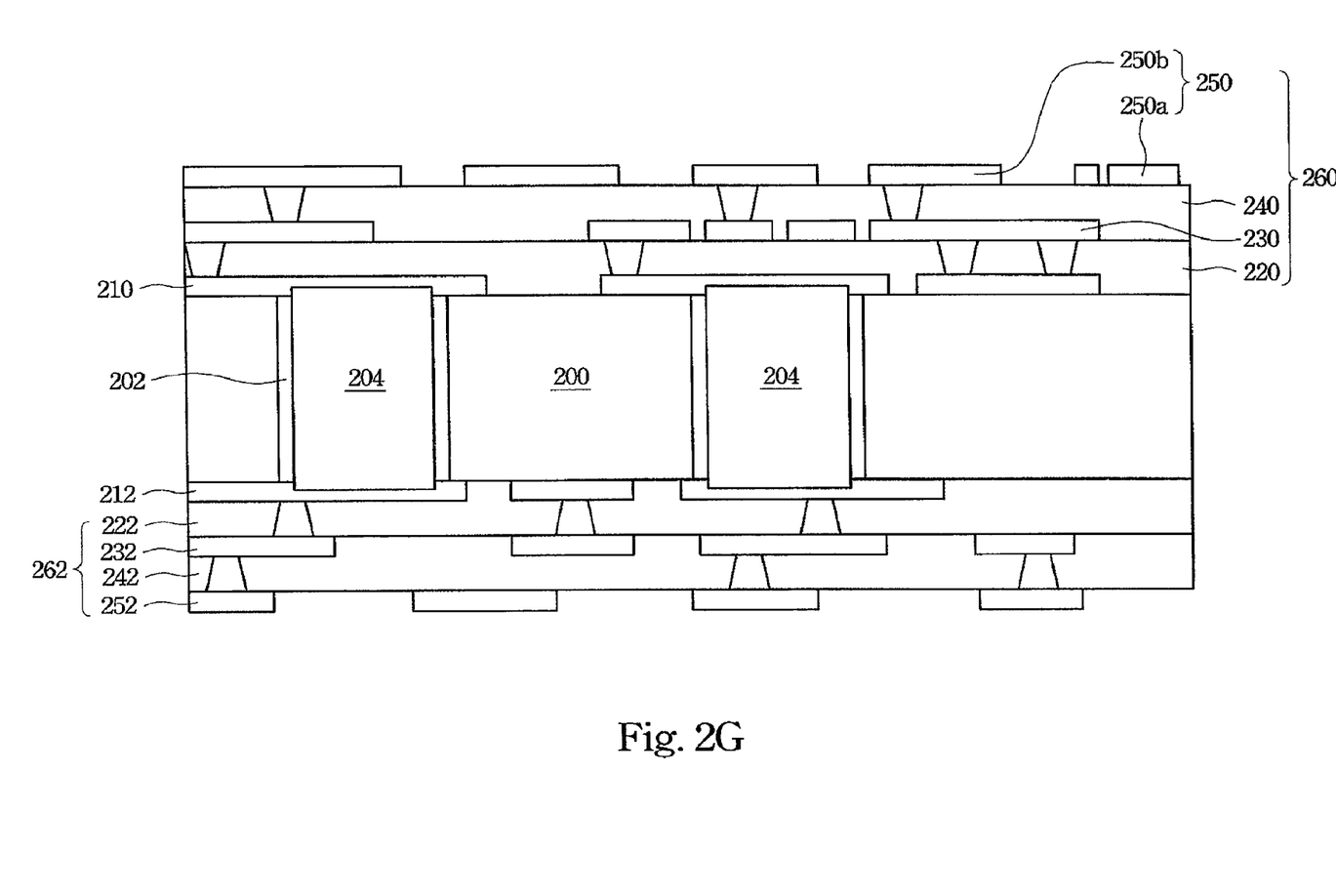
Figure 2H:
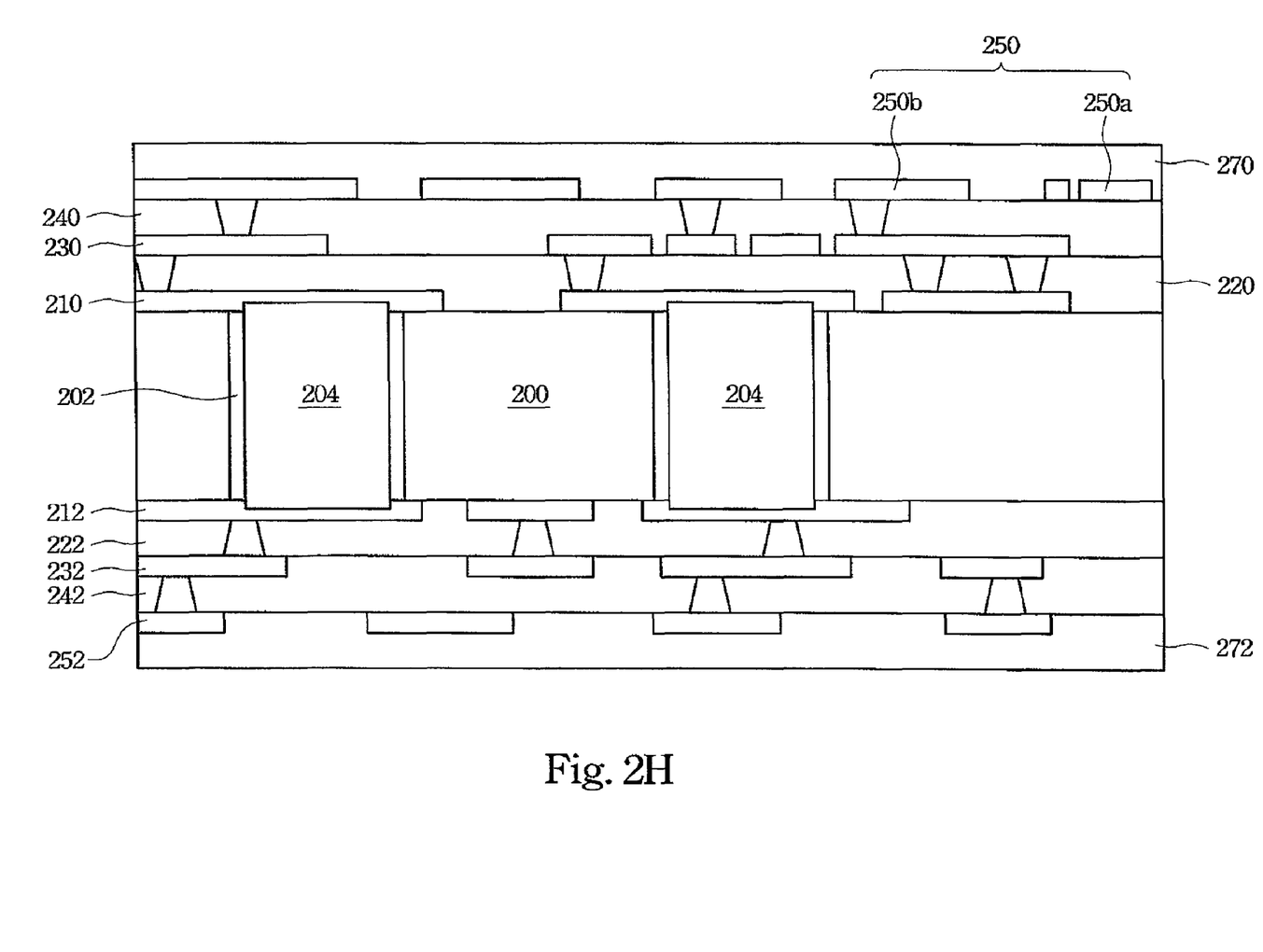
Figure 2I:
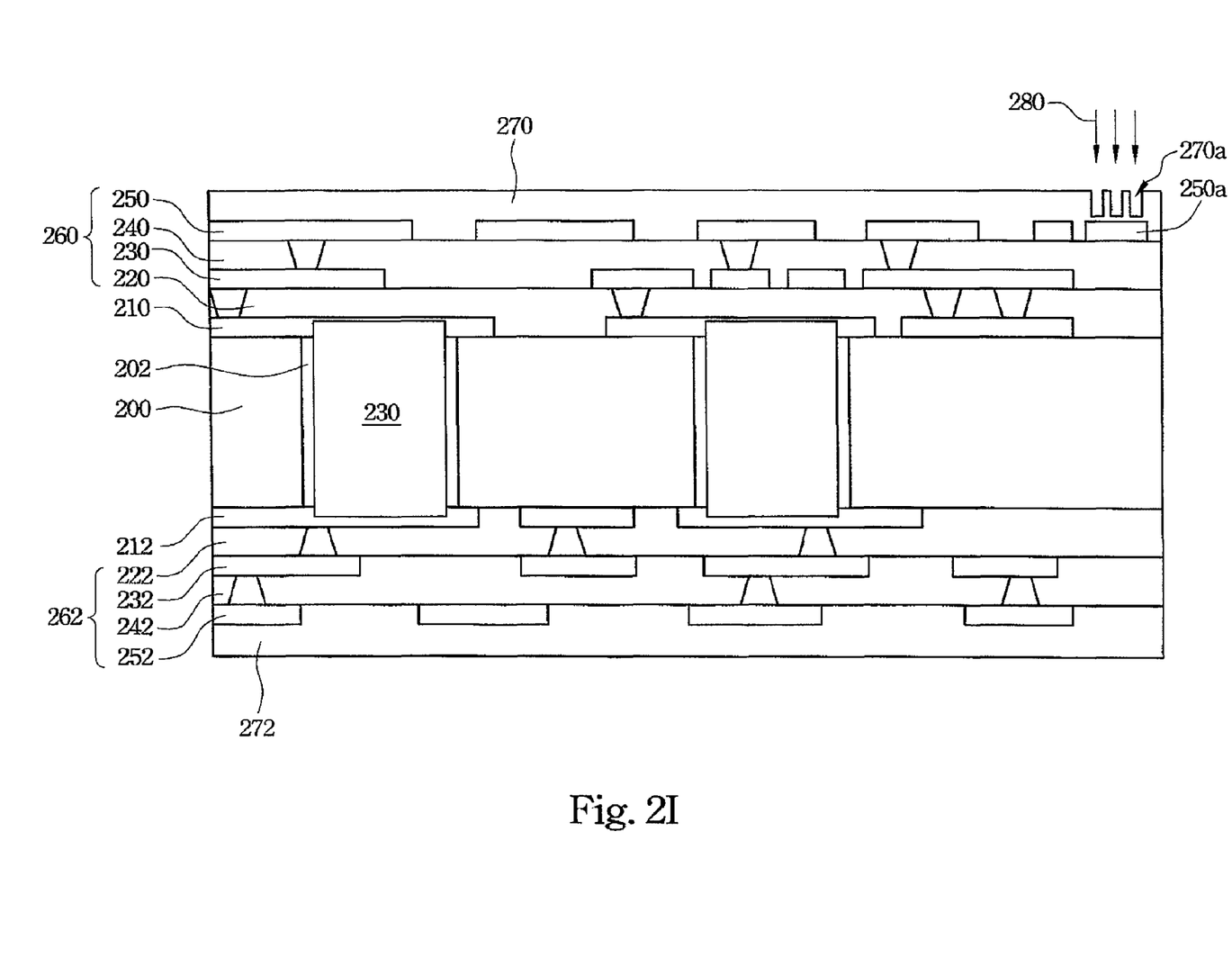
Figure 2J:
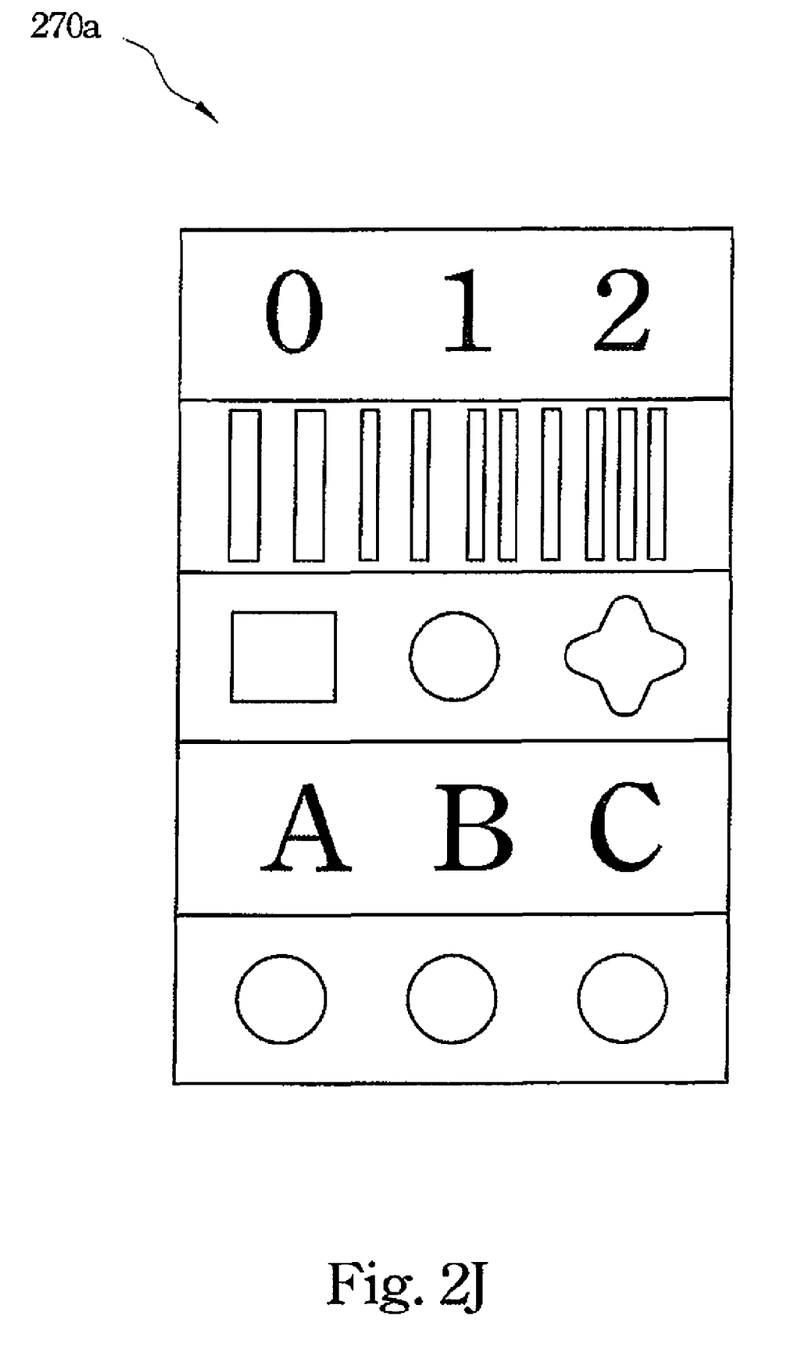

Reference is made to FIGS. 2A to 2J, which depict cross-sectional diagrams of the process flow of a substrate structure according to one preferred embodiment of the present invention. As shown in FIG. 2A, a core substrate 200 is provided, which includes a top surface 200a and a bottom surface 200b opposite the top surface 200a. The top surface 200a and the bottom surface 200b have circuit patterns 210 and 212 thereon, respectively. The core substrate 200 has at least one through hole (not shown) therethrough. A conductive layer 202 is disposed in the through hole for electrically connecting to the circuit patterns 210 and 212, and an insulating material 204 fills the through hole. Next, inner dielectric layers 220 and 222 are formed on the top surface 200a and the bottom surface 200b, respectively, so as to cover the circuit patterns 210 and 212, as shown in FIG. 2B. In this embodiment, the inner dielectric layers 220 and 222 may comprise ABF (Ajinomoto Buildup Film) and be formed by lamination type. However, the inner dielectric layers 220 and 222 may comprise other dielectric materials or be formed by other types but not limited to the above description. Moreover, a plurality of vias 220a and 222a are formed on the inner dielectric layers 220 and 222, respectively, so as to expose parts of the circuit patterns 210 and 212, as shown in FIG. 2C. In this embodiment, the vias 220a and 222a are formed by laser drilling procedure, or other procedures such as photolithography or mechanically drilling etc. rather than being limited to the above procedures. Furthermore, inner circuit layers 230 and 232 are formed on the inner dielectric layers 220 and 222, respectively, and fill the vias 220a and 222a, respectively, as shown in FIG. 2D, so as to electrically connect to the circuit patterns 210 and 212, respectively. In this embodiment, the inner circuit layers 230 and 232 may formed by the steps of coating conductive material, coating photoresist material and photolithography etc. Next, surface dielectric layers 240 and 242 are formed on the inner circuit layers 230 and 232, as shown in FIG. 2E. In this embodiment, the surface dielectric layers 240 and 242 may comprise ABF and be formed by lamination type. However, the surface dielectric layers 240 and 242 may comprise other dielectric materials or be formed by other types but not limited to the above description. And then, a plurality of vias 240a and 242a are formed on the surface dielectric layers 240 and 242, respectively, as shown in FIG. 2F. In this embodiment, the vias 240a and 242a may formed by laser drilling procedure, or other procedures such as photolithography or mechanically drilling etc. rather than being limited to the above procedures. Next, surface circuit layers 250 and 252 are formed on the surface dielectric layers 240 and 242, respectively, and fill the vias 240a and 242a, as shown in FIG. 2G. In this embodiment, the surface circuit layer 250 comprises a circuit layer 250b with virtual circuit connection and a dummy pattern 250a without any circuit connection; however, the surface circuit layer 250 also comprises circuit layers 250b with virtual circuit connection but is not limited to the above description. Alternatively, the dummy pattern 250a is a protective metal layer that is additionally formed on the surface dielectric layers 240 and has no circuit connection. The protective metal layer is employed to prevent a solder mask 270 subsequently covered thereon from over-drilling when the solder mask 270 is being drilled. It is worth mentioning that the inner dielectric layers 220 and 222, the inner circuit layers 230 and 232, the surface dielectric layers 240 and 242, and the surface circuit layers 250 and 252 may be interconnection portions 260 and 262 (shown in FIG. 2I) formed by the conventional build-up processes or lamination processes. However, the present invention does not limit the circuit and dielectric layers in the interconnection portions 260 and 262 to a certain quantity. Moreover, solder masks 270 and 272 are formed on the surface circuit layers 250 and 252, respectively, as shown in FIG. 2H, so as to protect the surface circuit layers 250 and 252. Furthermore, as shown in FIG. 2I, at least one hole 270a is formed on the solder mask 270, as well as above the dummy pattern 250, to be a mark for identifying the substrate. In this embodiment, the hole 270a is formed by laser 280 or other procedures such as photolithography or mechanically drilling etc. rather than being limited to the above procedures. It is worth mentioning that the hole 270a can pass through the solder mask 270 to expose a part of the dummy pattern 250a of the surface circuit layer 250 or a part of the protective metal layer. Alternatively, the hole 270a also does not pass through the solder mask 270, as shown in FIG. 2I. In this embodiment, the hole 270a may be formed in a shape of, for example, a numeral, a letter, or a geometrical pattern, as shown in FIG. 2J.

Figure 3:
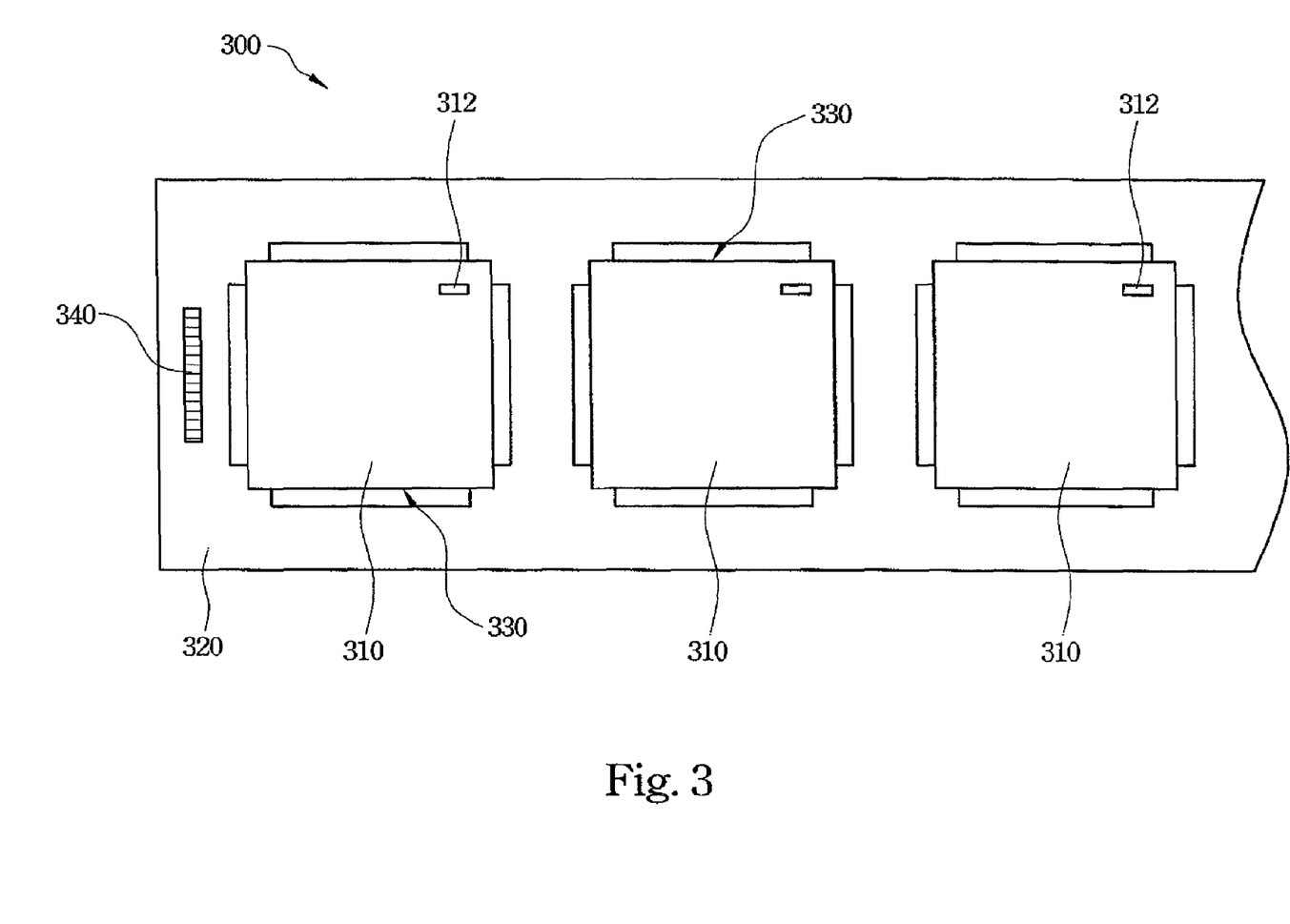
FIG. 3 is a top view of a substrate strip according to another embodiment of the present invention.

Reference is made to FIG. 3, which depicts a top view of a substrate strip according to another embodiment of the present invention. The substrate strip 300 is, for example, a multilayer board, which comprises a plurality of substrate units 310 and a frame 320. The frame 320 surrounds a periphery of the substrate units 310 for fixing and supporting the substrate units 310. Each substrate unit 310 is defined as a packaging area, which is assembled with a chip (not shown) together during a packaging process, so as to form a packaging structure (not shown). In this embodiment, the structure of the substrate unit 310 may be the one as shown in FIG. 2I. Comparatively, the frame 320 is defined as a non-packaging area. A plurality of slits 330, which are formed between the substrate unit 310 and the frame 320 by a routing process, separate the substrate 310 from the frame 320, so that the substrate unit 310 is partially connected to the frame 320. The structure of the substrate strip 300 of the present invention is characterized by not only the identification mark 340 disposed on the frame 320, but also another identification mark 312 disposed on the substrate unit 310. In this embodiment, the identification mark 312 may be the hole 270a as shown in FIG. 2I. Consequently, after completing the packaging process, the substrate strip 300 of the present invention may be still in a plurality of separate packaging structures. The lot number and related process information of the original substrate strip 300 is found via the identification mark 312 on the substrate unit 310, so as to decrease difficulties in monitoring process and trouble shooting, as well as to increase the yield of the product.

In brief, the substrate strip of the present invention is characterized by the identification mark directly fabricated on the substrate unit, for ensuring that the lot number of the substrate unit in the packaging structure can be still identified while the packaging process is completed, so as to overcome the prior problems of more difficulties in monitoring process and trouble shooting in the package structure, as well as the problem of the decreased yield. Therefore, in comparison with the prior substrate strip, the one of the present invention can be effectively monitored and identified in any stage of the packaging process, so as to substantially increase the quality of the product and to reduce the process defective rate.

According to the aforementioned preferred embodiments, one advantage of the substrate structure and the method for manufacturing the same is to manufacture an substrate structure having an identification mark fabricated thereon, in which the identification mark is at least one hole formed on a solder mask of the substrate structure by adding a drilling procedure, by using the prior process equipments instead of changing the existing prior process flow of the substrate structure. Therefore, in comparison with the conventional method for manufacturing the substrate structure, the method disclosed by the present invention, which is almost the same with the prior method for manufacturing the same, instead of changing the existing prior process flow, can manufacture the substrate structure having the identification mark.

As is understood by a person skilled in the art, the foregoing preferred embodiments of the present invention are illustrated of the present invention rather than limiting of the present invention. It is intended to cover various modifications and similar arrangements included within the spirit and scope of the appended claims. Therefore, the scope of which should be accorded the broadest interpretation so as to encompass all such modifications and similar structure.

What is claimed is:

1. A substrate structure comprising:
a core substrate comprising a top surface and a bottom surface opposite the top surface, wherein a first circuit pattern is disposed on the top surface;
a first interconnection portion disposed on the top surface, wherein the first interconnection portion comprises:
a first surface dielectric layer;
a first surface circuit layer and a dummy pattern disposed on the first surface dielectric layer, wherein the dummy pattern has no circuit connection with the first surface circuit layer;
a first inner circuit layer disposed below the first surface dielectric layer, wherein the first inner circuit layer is electrically connected to the first circuit pattern and the first surface circuit layer; and
a first inner dielectric layer disposed below the first inner circuit layer; and
a first solder mask disposed on the first interconnection portion, wherein the first solder mask has at least one hole disposed above the dummy pattern, and the hole exposes a part of the dummy pattern for identifying the substrate structure.

2. The substrate structure according to claim 1, wherein the hole is disposed above the first surface circuit layer to expose a part of the first surface circuit layer.

3. The substrate structure according to claim 1, wherein the first interconnection portion further comprises a via and the first surface circuit layer electrically connected to the first circuit pattern therethrough.

4. The substrate structure according to claim 1, wherein the hole is formed in a shape of a numeral, a letter or a geometrical pattern for identifying the substrate structure.

5. The substrate structure according to claim 1, wherein the bottom surface has a second circuit pattern thereon to electrically connect to the first circuit pattern through a through hole in the core substrate.

6. The substrate structure according to claim 1, wherein the interconnection portion is formed by a build-up process.

7. The substrate structure according to claim 5, further comprising:
a second interconnection portion disposed on the bottom surface, wherein the second interconnection portion comprises a second surface dielectric layer and a second surface circuit layer disposed thereon, and the second surface circuit layer is electrically connected to the second circuit pattern; and
a second solder mask disposed on the second interconnection portion.

8. A substrate strip, comprising:
a plurality of substrate units, wherein each of the substrate units comprises:
a core substrate, wherein the core substrate comprises a top surface and a bottom surface opposite the top surface, and a first circuit pattern is disposed on the top surface;
a first interconnection portion disposed on the top surface, wherein the first interconnection portion comprises:
a first surface dielectric layer;
a first surface circuit layer and a dummy pattern disposed on the first surface dielectric layer, wherein the dummy pattern has no circuit connection with the first surface circuit layer;
a first inner circuit layer disposed below the first surface dielectric layer, wherein the first inner circuit layer is electrically connected to the first circuit pattern and the first surface circuit layer; and
a first inner dielectric layer disposed below the first inner circuit layer; and
a first solder mask disposed on the first interconnection portion, wherein the first solder mask has at least one hole disposed above the dummy pattern, and the hole exposes a part of the dummy pattern for identifying each of the substrate units; and a frame surrounding a periphery of the substrate units for fixing and supporting the substrate units.

9. The substrate strip according to claim 8, wherein the hole is disposed above the first surface circuit layer to expose a part of the first surface circuit layer.

10. The substrate strip according to claim 8, wherein the first interconnection portion further comprises a via and the first surface circuit layer electrically connected to the first circuit pattern therethrough.

11. The substrate strip according to claim 8, wherein the frame has a mark disposed thereon for identifying the substrate strip.

12. The substrate strip according to claim 8, wherein the hole is formed in a shape of a numeral, a letter or a geometrical pattern for identifying the substrate structure.

13. The substrate strip according to claim 8, wherein the bottom surface has a second circuit pattern thereon to electrically connect to the first circuit pattern through a through hole in the core substrate.

14. The substrate strip according to claim 13, further comprising:
a second interconnection portion disposed on the bottom surface, wherein the second interconnection portion comprises a second surface dielectric layer and a second surface circuit layer disposed thereon, and the second surface circuit layer is electrically connected to the second circuit pattern; and
a second solder mask disposed on the second interconnection portion.

* * * * *